(12) United States Patent
Zheng et al.

(10) Patent No.: US 9,396,743 B1
(45) Date of Patent: Jul. 19, 2016

(54) SYSTEMS AND METHODS FOR CONTROLLING SOFT BIAS THICKNESS FOR TUNNEL MAGNETORESISTANCE READERS

(71) Applicant: Western Digital (Fremont), LLC, Fremont, CA (US)

(72) Inventors: Yi Zheng, San Ramon, CA (US); Ming Jiang, San Jose, CA (US); Anup G. Roy, Fremont, CA (US); Guanxiong Li, Fremont, CA (US); Ming Mao, Dublin, CA (US); Daniele Mauri, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/308,366

(22) Filed: Jun. 18, 2014

Related U.S. Application Data

(60) Provisional application No. 61/946,444, filed on Feb. 28, 2014.

(51) Int. Cl.
G11B 5/39 (2006.01)

(52) U.S. Cl.
CPC ............ *G11B 5/3909* (2013.01); *G11B 5/3906* (2013.01); *G11B 5/398* (2013.01)

(58) Field of Classification Search
CPC .. G11B 5/3912; G11B 5/3932; G11B 5/3909; G11B 5/3903; G11B 5/39; G11B 5/398; G11B 5/3906
USPC ...................................... 360/319, 324–324.2
See application file for complete search history.

(56) References Cited

U.S. PATENT DOCUMENTS

| | | |
|---|---|---|
| 6,016,290 A | 1/2000 | Chen et al. |
| 6,018,441 A | 1/2000 | Wu et al. |
| 6,025,978 A | 2/2000 | Hoshi et al. |
| 6,025,988 A | 2/2000 | Yan |
| 6,032,353 A | 3/2000 | Hiner et al. |
| 6,033,532 A | 3/2000 | Minami |
| 6,034,851 A | 3/2000 | Zarouri et al. |
| 6,043,959 A | 3/2000 | Crue et al. |
| 6,046,885 A | 4/2000 | Aimonetti et al. |
| 6,049,650 A | 4/2000 | Jerman et al. |
| 6,055,138 A | 4/2000 | Shi |
| 6,058,094 A | 5/2000 | Davis et al. |
| 6,073,338 A | 6/2000 | Liu et al. |
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |

(Continued)

*Primary Examiner* — Will J Klimowicz

(57) ABSTRACT

Systems and methods for controlling a thickness of a soft bias layer in a tunnel magnetoresistance (TMR) reader are provided. One such method involves providing a magnetoresistive sensor stack including a free layer and a bottom shield layer, performing contiguous junction milling on the sensor stack, depositing an insulating layer on the sensor stack, depositing a spacer layer on the insulating layer, performing an angled milling sub-process to remove preselected portions of the spacer layer, depositing a soft bias layer on the sensor stack, and depositing a top shield layer on the sensor stack and the soft bias layer. The method can further involve adjusting an alignment of a top surface of the spacer layer with respect to the free layer. In one such case, the top surface of the spacer layer is adjusted to be below the free layer.

11 Claims, 6 Drawing Sheets

(56) References Cited

U.S. PATENT DOCUMENTS

| | | | |
|---|---|---|---|
| 6,108,166 A | 8/2000 | Lederman |
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,466,419 B1 * | 10/2002 | Mao ................... 360/324.12 |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |

(56) References Cited

U.S. PATENT DOCUMENTS

| | | |
|---|---|---|
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,700,760 B1 * | 3/2004 | Mao ............................ 360/324.2 |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,744,608 B1 | 8/2004 | Hofstetter et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,130,165 B2 | 10/2006 | Macken et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,301,734 B2 | 11/2007 | Guo et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,443,632 B1 | 10/2008 | Stoev et al. |
| 7,444,740 B1 | 11/2008 | Chung et al. |
| 7,493,688 B1 | 2/2009 | Wang et al. |

(56) References Cited

U.S. PATENT DOCUMENTS

| | | |
|---|---|---|
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,583,466 B2 | 9/2009 | Kermiche et al. |
| 7,595,967 B1 | 9/2009 | Moon et al. |
| 7,599,154 B2 * | 10/2009 | Sbiaa et al. ............. 360/324.11 |
| 7,639,457 B1 | 12/2009 | Chen et al. |
| 7,660,080 B1 | 2/2010 | Liu et al. |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,968,219 B1 | 6/2011 | Jiang et al. |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,402,635 B2 * | 3/2013 | Degawa et al. ............ 29/603.14 |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |

(56) References Cited

U.S. PATENT DOCUMENTS

| | | |
|---|---|---|
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,576,518 B1 * | 11/2013 | Zeltser et al. ............ 360/319 |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 * | 12/2013 | Shang et al. ............ 360/324.12 |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 * | 1/2014 | Mauri et al. ............ 360/319 |
| 8,630,069 B1 * | 1/2014 | Okawa et al. ............ 360/319 |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 8,813,324 B2 | 8/2014 | Emley et al. |
| 8,885,300 B2 * | 11/2014 | McKinlay et al. ............ 360/319 |
| 8,976,492 B1 * | 3/2015 | Kataoka et al. ............ 360/319 |
| 9,099,109 B2 * | 8/2015 | Dimitrov et al. |
| 2004/0252419 A1 * | 12/2004 | Takano ............ 360/324.12 |
| 2005/0157431 A1 * | 7/2005 | Hatatani et al. ............ 360/319 |
| 2006/0196039 A1 * | 9/2006 | Sakai et al. ............ 29/603.08 |
| 2006/0198059 A1 * | 9/2006 | Sakai et al. ............ 360/324.12 |
| 2008/0117552 A1 * | 5/2008 | Zhou et al. ............ 360/319 |
| 2010/0290157 A1 | 11/2010 | Zhang et al. |
| 2011/0007429 A1 * | 1/2011 | Dimitrov et al. ............ 360/319 |
| 2011/0086240 A1 | 4/2011 | Xiang et al. |
| 2012/0111826 A1 | 5/2012 | Chen et al. |
| 2012/0216378 A1 | 8/2012 | Emley et al. |
| 2012/0237878 A1 | 9/2012 | Zeng et al. |
| 2012/0240390 A1 * | 9/2012 | Degawa et al. ............ 29/603.01 |
| 2012/0298621 A1 | 11/2012 | Gao |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2014/0154529 A1 | 6/2014 | Yang et al. |
| 2014/0168822 A1 * | 6/2014 | Le et al. ............ 360/294 |
| 2014/0175050 A1 | 6/2014 | Zhang et al. |
| 2014/0218823 A1 * | 8/2014 | McKinlay ............ G11B 5/398 360/128 |
| 2015/0154991 A1 * | 6/2015 | Le et al. |

* cited by examiner

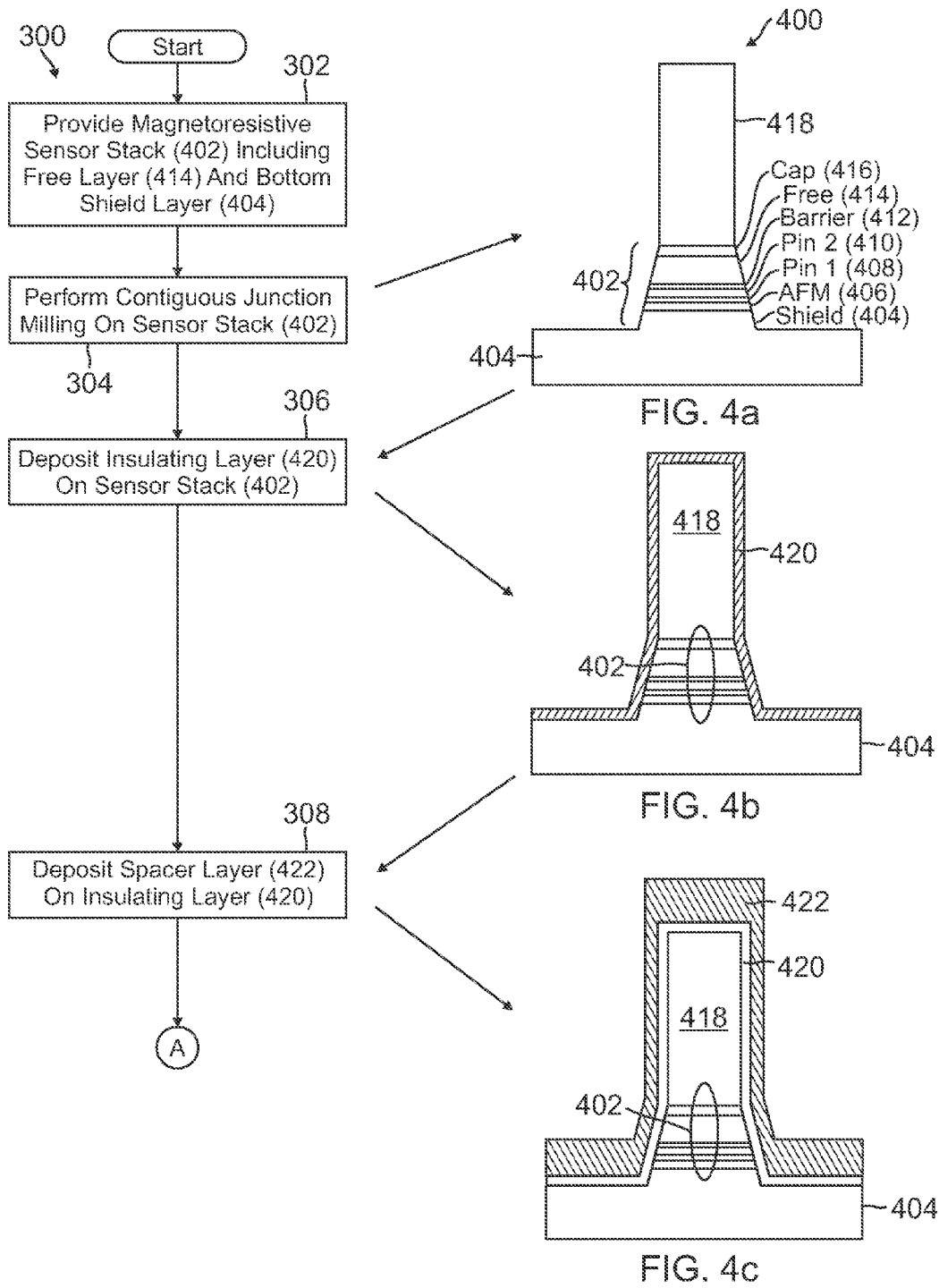

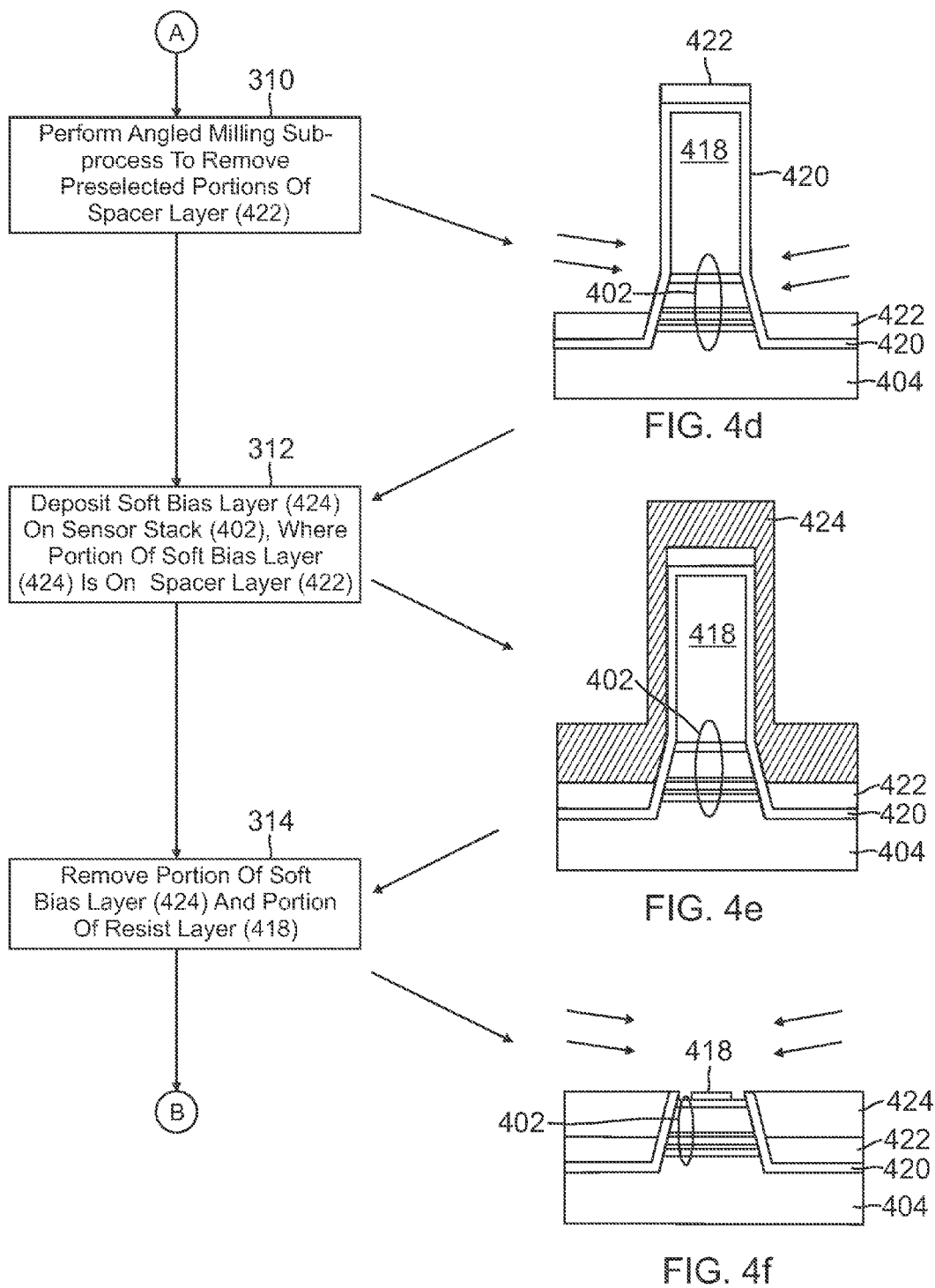

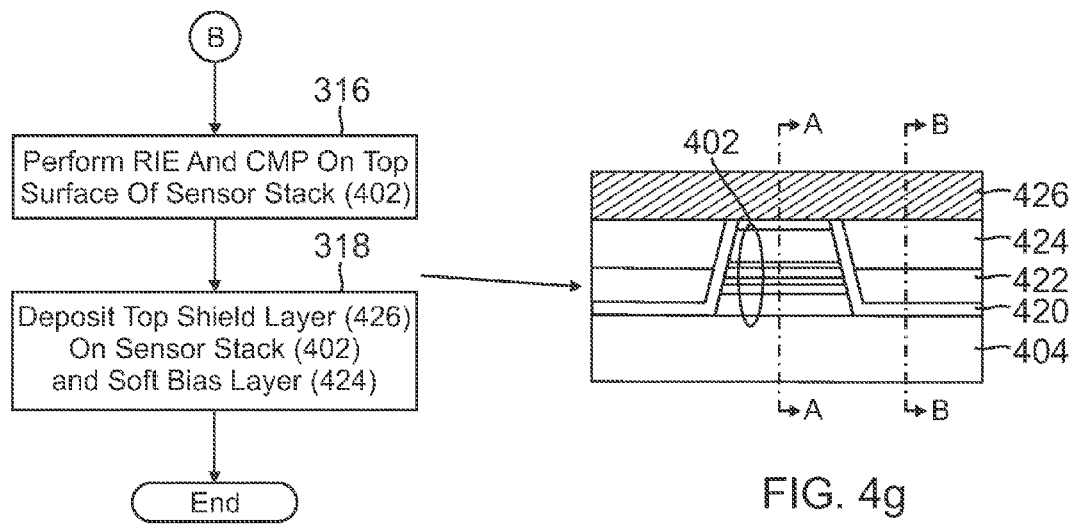
FIG. 4g
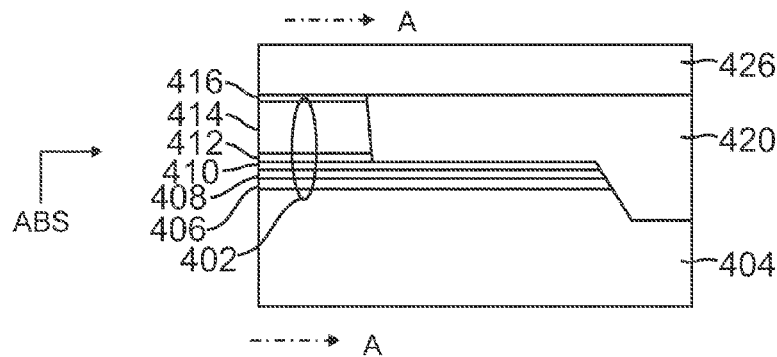
FIG. 4g-AA
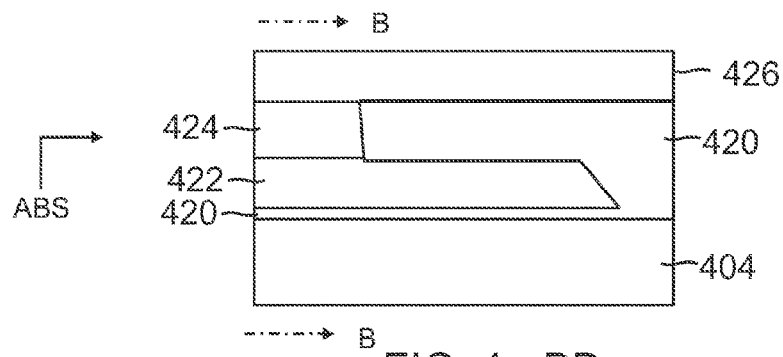
FIG. 4g-BB

SYSTEMS AND METHODS FOR CONTROLLING SOFT BIAS THICKNESS FOR TUNNEL MAGNETORESISTANCE READERS

CROSS-REFERENCE TO RELATED APPLICATION(S)

This application claims priority to and the benefit of U.S. Provisional Application No. 61/946,444, filed on Feb. 28, 2014, and entitled, "SYSTEMS AND METHODS FOR MINIMIZING SOFT BIAS MATERIAL ON PIN LAYER FOR TUNNEL MAGNETORESISTANCE READERS", the entire content of which is incorporated herein by reference.

BACKGROUND

Magnetic storage systems, such as a hard disk drive (HDD), are utilized in a wide variety of devices in both stationary and mobile computing environments. Examples of devices that incorporate magnetic storage systems include desktop computers, portable notebook computers, portable hard disk drives, digital versatile disc (DVD) players, high definition television (HDTV) receivers, vehicle control systems, cellular or mobile telephones, television set top boxes, digital cameras, digital video cameras, video game consoles, and portable media players.

A typical disk drive includes magnetic storage media in the form of one or more flat disks. The disks are generally formed of two main substances, namely, a substrate material that gives it structure and rigidity, and a magnetic media coating that holds the magnetic impulses or moments that represent data. Such typical disk drives also typically include a read head and a write head, generally in the form of a magnetic transducer which can sense and/or change the magnetic fields stored on the disks. Perpendicular magnetic recording (PMR) involves recorded bits that are stored in a generally planar recording layer but in a generally perpendicular or out-of-plane orientation with respect to the recording layer. A PMR read head and a PMR write head are usually formed as an integrated read/write head along an air-bearing surface (ABS). In a PMR reader, a tunnel magnetoresistance (TMR) sensor is frequently employed in the read head.

A TMR sensor generally includes a patterned TMR structure or stack having two ferromagnetic layers separated by an insulating barrier layer (e.g., MgO). One ferromagnetic layer is magnetically oriented in a fixed direction (the "pinned layer") and the other ferromagnetic layer rotates in response to an external magnetic field (the "free layer"). The TMR sensor also typically includes a hard or soft bias (SB) layer disposed on either side of the TMR stack. The hard or soft bias layer can include a permanent or soft magnetic material and can provide a bias field along a direction perpendicular to layers of the TMR stack. The resistance of the device is dependent on the relative orientation between the two ferromagnetic layers. In a TMR read head, a sense current passes perpendicularly through layers of the TMR stack. The magnetic transitions between adjacent oppositely-directed magnetized regions cause changes in electrical resistance that are detected by the TMR sensor.

One such TMR sensor design involves use of an extended pin layer (XPL). The extended pin layer (XPL) design provides extra pinned layer and anti-ferromagnetic (AFM) layer volume to enhance pinning thermal stability of the sensor, and thereby improve device stability at smaller stripe heights (SH) and free layer track widths (FLTW). However, when this extra layer volume is incorporated with the soft bias (SB) layer, the performance of the sensor can be degraded.

BRIEF DESCRIPTION OF THE DRAWINGS

FIGS. 4a to 4g illustrate a sequence of views from an air bearing surface (ABS) of a tunnel magnetoresistance (TMR) reader in a fabrication process for controlling a thickness of a soft bias layer using a spacer layer in accordance with one embodiment of the invention.

FIG. 4g-AA is a cross sectional view of the TMR reader of FIG. 4g taken across the section A-A which extends both vertically through the sensor stack and into the page to illustrate a rear area of the sensor stack including the extended pin layer.

FIG. 4g-BB is a cross sectional view of the TMR reader of FIG. 4g taken across the section B-B which extends both vertically through a peripheral area of the sensor stack and into the page to illustrate a rear area of the soft bias structure.

DETAILED DESCRIPTION

Figure 1:
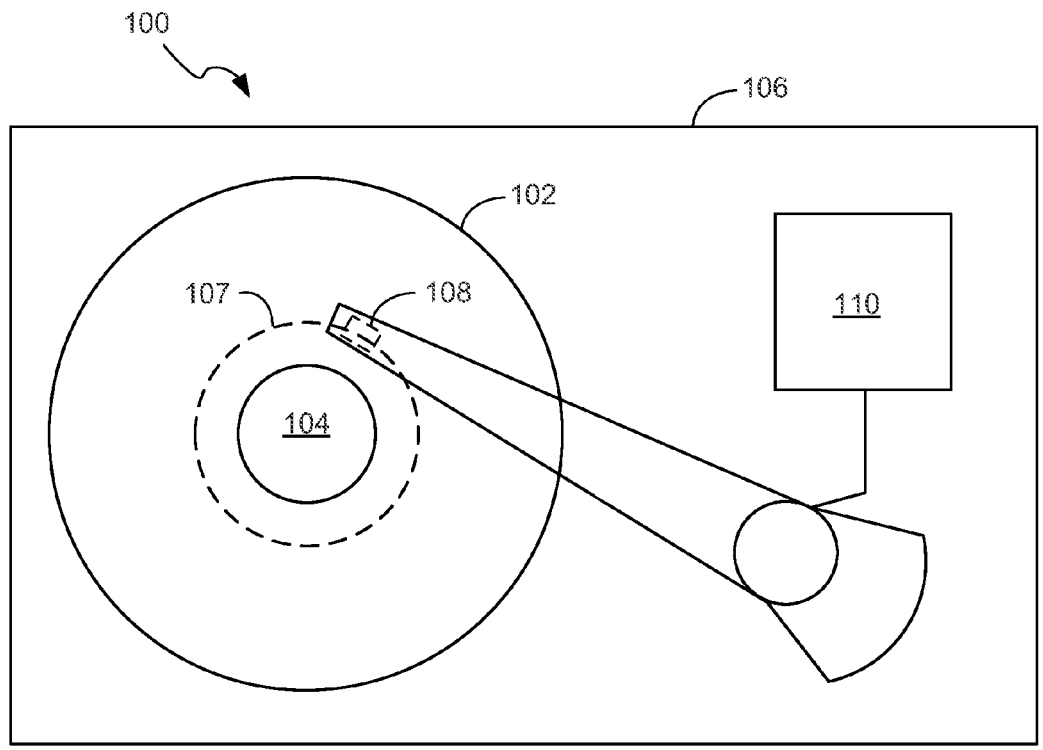
FIG. 1 is a top schematic view of a disk drive including a slider with a tunnel magnetoresistance (TMR) reader including a spacer layer for controlling the thickness of a soft bias layer during TMR reader fabrication in accordance with one embodiment of the invention.

Referring now to the drawings, embodiments of systems and methods for controlling a thickness of a soft bias layer in a tunnel magnetoresistance (TMR) reader are provided. The methods can involve providing a magnetoresistive sensor stack including a free layer and a bottom shield layer, performing a contiguous junction milling on the sensor stack, depositing an insulating layer on the sensor stack, depositing a spacer layer on the insulating layer, performing an angled milling sub-process to remove preselected portions of the spacer layer, depositing a soft bias layer on the sensor stack, where at least a portion of the soft bias layer is on the spacer layer, and depositing a top shield layer on the sensor stack and the soft bias layer.

A TMR reader fabricated using one of the methods described herein can include a magnetoresistive sensor stack including a free layer and a bottom shield layer and having angled sides, a soft bias structure adjacent to the sensor stack, where the soft bias structure includes a portion of the bottom shield layer, an insulating layer on the portion of the bottom shield layer and on the angled sides of the sensor stack, a spacer layer on the insulating layer, a soft bias layer on the spacer layer, and a top shield layer on the soft bias layer, where a top surface of the spacer layer is below the free layer.

The patterned spacer layer can ensure a preferred vertical positioning of the soft bias layer with respect to the free layer in the sensor stack. The patterned spacer layer can also ensure that a rear area of the soft bias structure (disposed adjacent to the sensor stack and behind the sensor stack in a direction away from an air bearing surface or ABS of the sensor stack) is substantially free of the soft bias layer. This preferred vertical positioning of the soft bias layer and the substantial elimination of the soft bias layer in the noted rear areas can provide improved performance for a TMR reader.

FIG. 1 is a top schematic view of a disk drive 100 including a slider 108 with a tunnel magnetoresistance (TMR) reader including a spacer layer for controlling a thickness of a soft bias layer during TMR reader fabrication in accordance with one embodiment of the invention. Disk drive 100 may include one or more of the disks/media 102 to store data. Disks/media 102 reside on a spindle assembly 104 that is mounted to drive housing 106. Data may be stored along tracks 107 in the magnetic recording layer of disk 102. The reading and writing of data is accomplished with the slider/head 108 that can have both read and write elements. The write element (see 108a in FIG. 2) is used to alter the properties of the magnetic recording layer of disk 102 and thereby write information thereto. In one embodiment, head 108 may have tunnel magneto-resistance (TMR) elements. The reader element (see 108b in FIG. 2) is used to read information stored on the magnetic recording layer of disk 102.

In operation, a spindle motor (not shown) rotates the spindle assembly 104, and thereby rotates disk 102 to position head 108 at a particular location along a desired disk track 107. The position of head 108 relative to disk 102 may be controlled by position control circuitry 110.

Figure 2:
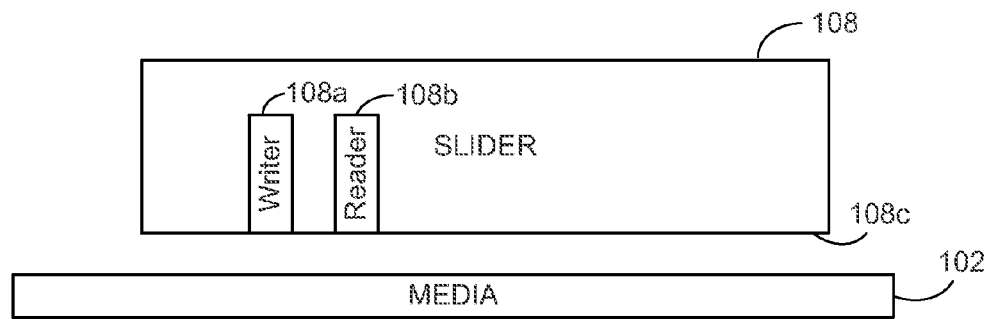
FIG. 2 is a side schematic view of the slider of FIG. 1 with the tunnel magnetoresistance (TMR) reader including the spacer layer for controlling a thickness of the soft bias layer during TMR reader fabrication in accordance with one embodiment of the invention.

FIG. 2 is a side schematic view of the slider 108 of FIG. 1 with the tunnel magnetoresistance (TMR) reader 108b including the spacer layer for controlling the thickness of the soft bias layer during TMR reader fabrication in accordance with one embodiment of the invention. The slider 108 includes both the writer 108a and TMR reader 108b disposed along an air bearing surface (ABS) 108c of the slider. The ABS 108c is the bottom surface of the slider 108 and is the slider surface that is closest to the media 102. As will be discussed in further detail below, the TMR reader 108b includes a spacer layer (not visible but see component 422 in FIG. 4c) for controlling the thickness of the soft bias layer (not visible but see component 424 in FIG. 4e) during fabrication of the TMR reader.

Figure 3:
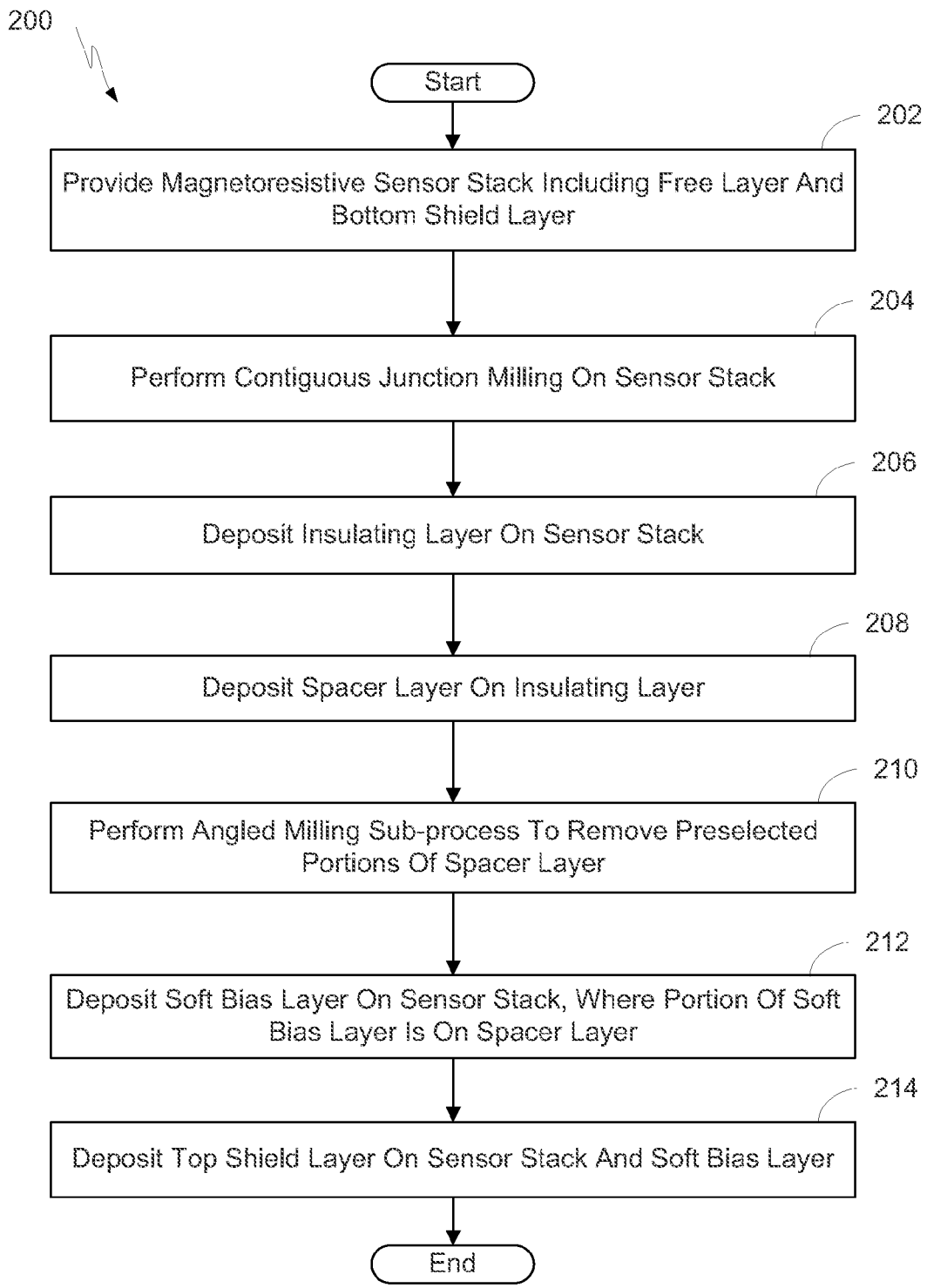
FIG. 3 is a flowchart of a general process for controlling a thickness of a soft bias layer during fabrication of a tunnel magnetoresistance (TMR) reader using a spacer layer in accordance with one embodiment of the invention.

FIG. 3 is a flowchart of a general process 200 for controlling a thickness of a soft bias layer during fabrication of a tunnel magnetoresistance (TMR) reader using a spacer layer in accordance with one embodiment of the invention. In several embodiments, process 200 can be used to fabricate TMR readers such as the TMR reader 108b of FIG. 2. In block 202, the process provides a magnetoresistive sensor stack including a free layer and a bottom shield layer. In several embodiments, the sensor stack can also include an anti-ferromagnetic pinning layer on the bottom shield layer, a pinned layer on the anti-ferromagnetic pinning layer, a barrier layer on the pinned layer, the free layer on the barrier layer, and a capping layer on the free layer. In block 204, the process performs a contiguous junction milling on the sensor stack. In block 206, the process deposits an insulating layer on the sensor stack. In one embodiment, the pinned layer is a bi-layer.

In block 208, the process deposits a spacer layer on the insulating layer. In several embodiments, the spacer layer is made of one or more non-magnetic materials. For example, in one such embodiment, the spacer layer is made of an alloy such as NiFeCr, NiCr, Ta, Ru, Cr, and oxides of NiFeCr, NiCr, Ta, and Cr, and combinations thereof. In one embodiment, the spacer layer consists of one or more non-magnetic materials.

In block 210, the process performs an angled milling sub-process to remove preselected portions of the spacer layer. In some embodiments, the process performs an angled milling sub-process to effectively adjust an alignment of a top surface of the spacer layer with respect to the free layer. In one such case, the process adjusts an alignment of the top surface of the spacer layer such that it is below the free layer. In block 212, the process deposits a soft bias layer on the sensor stack, where at least a portion of the soft bias layer is on the spacer layer. In block 214, the process deposits a top shield layer on the sensor stack and the soft bias layer.

In one embodiment, the bottom shield layer can be made of NiFe, NiCo, CoFe, NiFeCo, CoB, CoFeB, and/or combinations thereof. The anti-ferromagnetic pinning layer can be made of IrMn, IrMnCr, and/or combinations thereof. In one embodiment, the pinned layer can be made of CoFe, CoB, CoFeB, and/or combinations thereof. The barrier layer can be made of MgO, AlOx, and combinations thereof, where x is a positive integer. In one embodiment, the free layer can be made of NiFe, NiCo, CoFe, Fe, NiFeCo, CoB, CoFeB, Ru, Ta, and/or combinations thereof. In one embodiment, the capping layer can be made of Ru, Ta, Ti, MgO, and/or combinations thereof. In other embodiments, other suitable materials known in the art can be used for any of the sensor stack layers.

In one embodiment, the soft bias layer is made of NiFe, NiCo, CoFe, NiCoFe, CoB, CoFeB, Ru, and/or combinations thereof. In some embodiments, the insulating layer is made of alumina, MgO, SiN, SiO2, and/or combinations thereof.

FIGS. 4a to 4g illustrate a sequence of views from the ABS of a tunnel magnetoresistance (TMR) reader 400 in a fabrication process 300 for controlling a thickness of a soft bias layer using a spacer layer in accordance with one embodiment of the invention.

In FIG. 4a, the process first provides (302) a magnetoresistive sensor stack 402 including a free layer 414 and a bottom shield layer 404. The sensor stack 402 includes the bottom shield layer 404, an anti-ferromagnetic pinning layer 406 on the bottom shield layer 404, a first pinned layer 408 on the anti-ferromagnetic pinning layer 406, a second pinned layer 410 on the first pinned layer 408, a barrier layer 412 on the second pinned layer 410, the free layer 414 on the barrier layer 412, and a capping layer 416 on the free layer 414. A thick resist layer 418 is on the capping layer 416. In FIG. 4a, the process also performs (304) contiguous junction milling on the sensor stack 402 to give it the tapered/angled sides. The resist layer 418 can protect the sensor stack 402 during the contiguous junction milling and other fabrication sub-processes. In FIG. 4a, the sensor stack 402 is shown to have a structure with particular layers. In other embodiments, the sensor stack 402 may have another suitable arrangement of layers as is known in the art. For example, in one embodiment, the sensor stack 402 may have only one pinned layer. The sensor stack 402 also has angled sides such that a width of the sensor stack 402 narrows as the sensor stack 402 extends in a direction substantially perpendicular to the bottom shield layer 404 and toward the capping layer 416 from the bottom shield layer 404.

In FIG. 4b, the process deposits (306) an insulating layer 420 on the sensor stack 402. In one embodiment, the insulating layer 420 can be made of alumina (e.g., Al2O3). In other embodiments, the insulating layer 420 can be made of MgO, SiN, SiO2, and/or combinations thereof.

In FIG. 4c, the process deposits (308) a spacer layer 422 on the insulating layer 420. In several embodiments, the spacer layer 422 can be made of one or more non-magnetic materials. In one such embodiment, the spacer layer 422 can be made of a non-magnetic material with properties such as good soft bias growth seed and better angular milling selectivity. As to the good soft bias growth property, in one embodiment, the spacer layer (e.g., seed layer) can have small grain size to provide a smooth surface and include materials that provide favorable growth texture to enable the soft bias layer to be sufficiently soft. As to the angular milling selectivity property, in one aspect, the materials for the spacer layer can have a suitable angular etch selectivity such that it can preferentially enable cleaning (e.g., easy removal) of the spacer materials along the angled sides of the sensor stack. In one embodiment, the spacer layer 422 can be made of NiFeCr, NiCr, Ta, Ru, Cr, oxides of these materials, and/or combinations thereof.

In FIG. 4d, the process performs (310) an angled milling sub-process to remove preselected portions of the spacer layer 422. More specifically, process can remove portions of the spacer layer 422 along the angled sides of the sensor stack 402. In one embodiment, the process removes portions of the spacer layer 422 along the angled sides of the sensor stack 402 that are above the free layer 414 such that a top surface of the spacer layer 422 is positioned below the free layer 414. In some embodiments, the process also removes portions of the insulating layer 420 along the angled sides of the sensor stack 402. In one embodiment, the angled milling sub-process can be referred to as a tip mill sub-process. In one embodiment, the angled milling sub-process can use a milling angle of about 70 degrees to about 86 degrees, with reference to a line perpendicular to layers of the sensor stack 402. In another embodiment, the angled milling sub-process can use a milling angle of about 78 degrees to about 82 degrees.

In FIG. 4e, the process deposits (312) a soft bias layer 424 on the sensor stack 402, where at least a portion of the soft bias layer 424 is on the spacer layer 422. As can be seen in FIG. 4e, at least a portion of the soft bias layer 424 is also on the insulating layer 420 (e.g., along the angled sides of the sensor stack 402). In one embodiment, the soft bias layer is made of NiFe, NiCo, CoFe, NiCoFe, CoB, CoFeB, Ru, and/or combinations thereof.

In FIG. 4f, the process removes (314) a portion of the soft bias layer 424 and a portion of the resist layer 418. In one embodiment, the process removes these components using a milling sub-process. In other embodiments, other suitable sub-processes for removing these sorts of layer can be used.

In FIG. 4g, the process performs (316) reactive ion etching (RIE) and chemical mechanical polishing (CMP) on a top surface of the sensor stack 402. In FIG. 4g, the process then deposits (318) a top shield layer 426 on the sensor stack 402 and the soft bias layer 424. In some embodiments, the top shield layer 426 may also be planarized.

In one embodiment, a portion of the TMR reader 400 peripheral to the sensor stack 402 (e.g., along section line B-B) can be referred to as a soft bias structure. The soft bias structure can include a portion of the bottom shield layer 404, the insulating layer 420 on the portion of the bottom shield layer 404 and on the angled sides of the sensor stack 402, the spacer layer 422 on the insulating layer 420, the soft bias layer 424 on the spacer layer 422, and the top shield layer 426 on the soft bias layer 424.

FIG. 4g-AA is a cross sectional view of the TMR reader 400 of FIG. 4g taken across the section A-A which extends both vertically through the sensor stack 402 and into the page to illustrate a rear area of the sensor stack 402 including the extended pin layer (408, 410). The air bearing surface (ABS) of the TMR reader 400 is along the left edge in FIG. 4g-AA. Note that the view of the TMR reader 400 depicted in FIG. 4g is a view from the ABS. Note also that no (or minimal) soft bias layer or spacer layer materials are found in FIG. 4g-AA (e.g., none behind sensor stack 402).

FIG. 4g-BB is a cross sectional view of the TMR reader 400 of FIG. 4g taken across the section B-B which extends both vertically through a peripheral area of the sensor stack 402 (e.g., the soft bias structure) and into the page to illustrate a rear area of the soft bias structure. The air bearing surface (ABS) of the TMR reader 400 is along the left edge in FIG. 4g-BB. As can be seen in FIG. 4g-BB, while the spacer layer 422 is present, the soft bias layer 424 is substantially eliminated from a rear area (e.g., area beyond the rear edge of the free layer 414 of the sensor stack 402 in FIG. 4g-AA) of the soft bias structure. As can be seen in FIG. 4g-BB, the soft bias structure (e.g., from soft bias layer 424 extended along projection of the width of the soft bias layer 424 downward through the bottom shield layer 404) is positioned between the rear area and the ABS.

In one embodiment, the processes of FIG. 3 and FIG. 4 can perform the sequence of actions in a different order than depicted. In another embodiment, the process can skip one or more of the actions. In other embodiments, one or more of the actions are performed simultaneously. In some embodiments, additional actions can be performed.

Figure 5A:
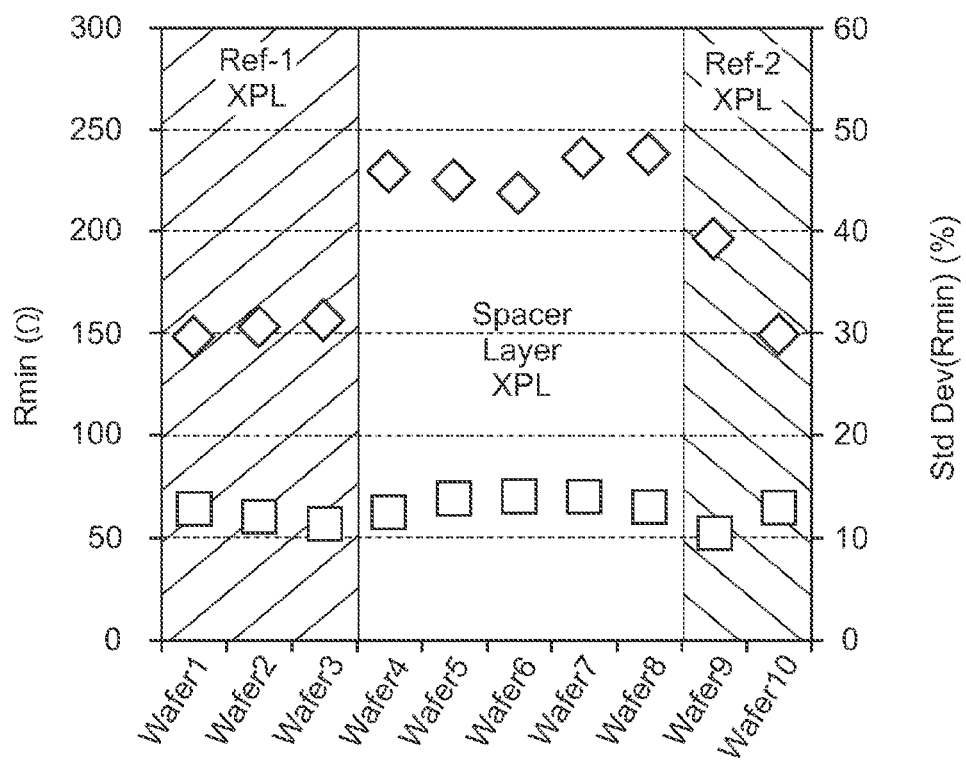
FIG. 5a is a graph of tunnel magnetoresistance (TMR) reader resistance illustrating performance testing results for a reader with a patterned spacer layer ("Spacer Layer XPL") as compared to reference readers including a "Ref-1 XPL" reader and a "Ref-2 XPL" reader in accordance with one embodiment of the invention.

FIG. 5a is a graph of tunnel magnetoresistance (TMR) reader resistance illustrating performance testing results for a reader with a patterned spacer layer ("Spacer Layer XPL") as compared to reference readers including a "Ref-1 XPL" reader and a "Ref-2 XPL" reader in accordance with one embodiment of the invention. The graph of FIG. 5a contains diamond shapes representing minimum resistance values (Rmin measured in ohms) measured during testing on TMR readers from various wafers (e.g., Wafer1, Wafer2, etc.), and square shapes representing standard deviation of the Rmin values measured in percentage. Effectively, the graph illustrates that the spacer layer reader ("Spacer Layer XPL") provides sufficient or better minimum resistance values (Rmin) as compared to the "Ref-1 XPL" type readers and the "Ref-2 XPL" type readers that do not include a patterned spacer layer.

Figure 5B:
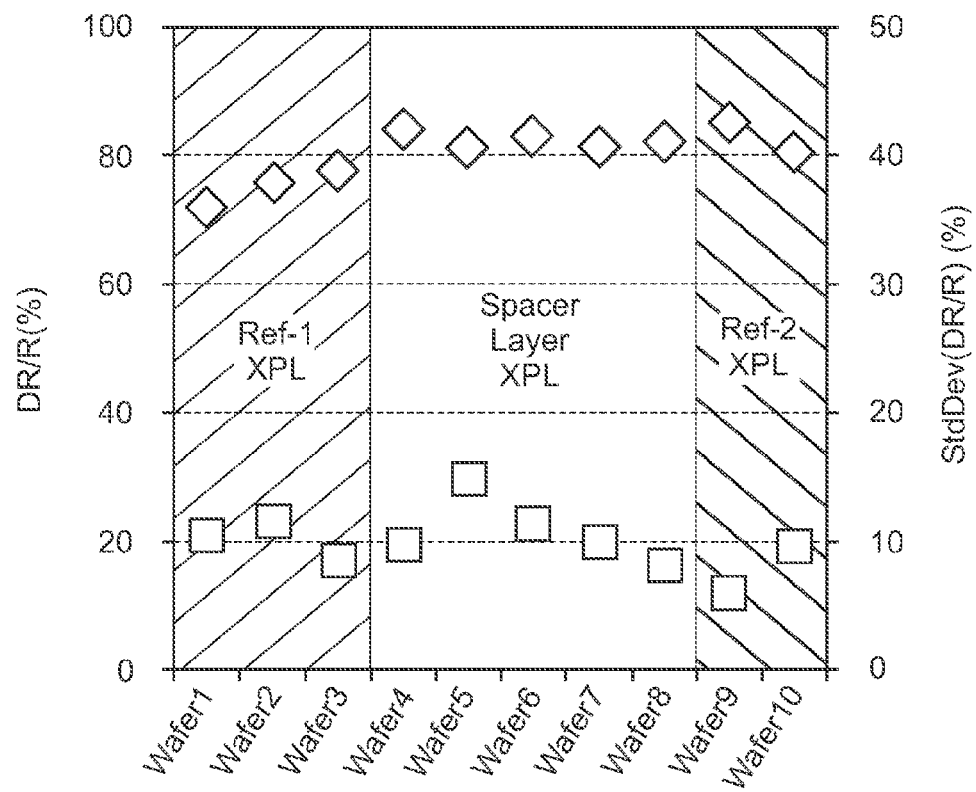
FIG. 5b is a graph of tunnel magnetoresistance (TMR) reader (DR/R) performance testing results for a reader with a patterned spacer layer ("Spacer Layer XPL") as compared to reference readers including a "Ref-1 XPL" reader and a "Ref-2 XPL" reader in accordance with one embodiment of the invention.

FIG. 5b is a graph of tunnel magnetoresistance (TMR) reader (DR/R) performance testing results for a reader with a patterned spacer layer ("Spacer Layer XPL") as compared to reference readers including a "Ref-1 XPL" reader and a "Ref-2 XPL" reader in accordance with one embodiment of the invention. The graph of FIG. 5b contains diamond shapes representing the giant magnetoresistive (GMR) ratio (DR/R measured in percentage) measured during testing on TMR readers from various wafers (e.g., Wafer1, Wafer2, etc.), and square shapes representing standard deviation of the DR/R values also measured in percentage. Effectively, the graph illustrates that the spacer layer reader ("Spacer Layer XPL") provides sufficient or better minimum GMR ratio values (DR/R) as compared to the "Ref-1 XPL" type readers and the "Ref-2 XPL" type readers that do not include a patterned spacer layer.

In several embodiments, the systems and methods for controlling a thickness of a soft bias layer in a tunnel magnetoresistance (TMR) reader described in this disclosure relate to incorporating a controllable milling step at grazing incidence after non-magnetic spacer layer depositions to remove junction sidewall deposition of a portion of the spacer layer material. In such case, the systems and methods described in this disclosure can control and optimize separation between the soft bias layer and the free layer. The systems and methods described in this disclosure can provide a number of advantages. In one aspect for example, they can provide a reduced thickness of the soft bias layer without sacrificing preferred spacing between the soft bias and free layers. The preferred spacing depends on the overall design to facilitate the best performance by sufficiently biasing free layer to stabilize free layer response. For example, a reduction of the spacer layer thickness might provide more bias and stability to the free layer, while increasing the space layer thickness might reduces the biasing field to the free layer. In another aspect, the systems and methods described in this disclosure can enable a soft bias type reader with an extended pin layer (XPL) to be free, or substantially free, of soft bias residue behind the MR stripe (e.g., sensor stack).

In some aspects, the systems and methods described herein can ensure that zero or very few AFM layer corrosion and atomic layer deposition recess problems result in the fabricated TMR reader. In addition, use of a full contiguous junction milling sub-process can allow for better reader physical control and narrow track reader extendibility, thereby making the overall fabrication process easier. In one aspect, the systems and methods described herein also help to maintain full reader magnetic benefits with reduced soft bias thickness and better reader track width control and extendibility.

The terms "above," "below," and "between" as used herein refer to a relative position of one layer with respect to other layers. As such, one layer deposited or disposed above or below another layer may be directly in contact with the other layer or may have one or more intervening layers. Moreover, one layer deposited or disposed between layers may be directly in contact with the layers or may have one or more intervening layers.

It shall be appreciated by those skilled in the art in view of the present disclosure that although various exemplary fabrication methods are discussed herein with reference to magnetic read heads. In several embodiments, the deposition of such layers can be performed using a variety of deposition sub-processes, including, but not limited to physical vapor deposition (PVD), sputter deposition and ion beam deposition, and chemical vapor deposition (CVD) including plasma enhanced chemical vapor deposition (PECVD), low pressure chemical vapor deposition (LPCVD) and atomic layer chemical vapor deposition (ALCVD). In other embodiments, other suitable deposition techniques known in the art may also be used.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

What is claimed is:

1. A tunnel magnetoresistance reader comprising:
   a magnetoresistive sensor stack comprising a free layer and a bottom shield layer and having angled sides;
   a soft bias structure adjacent to the sensor stack, wherein the soft bias structure comprises:
      a portion of the bottom shield layer;
      an insulating layer on the portion of the bottom shield layer and on the angled sides of the sensor stack;
      a non-magnetic spacer layer directly on the insulating layer;
      a soft bias layer directly on the spacer layer; and
      a top shield layer directly on the soft bias layer;
   wherein the spacer layer is entirely below the free layer.

2. The tunnel magnetoresistance reader of claim 1:
   wherein the soft bias structure comprises an air bearing surface;
   wherein a rear area of the soft bias structure is substantially free of the soft bias layer; and
   wherein the soft bias structure is positioned between the rear area and the air bearing surface.

3. The tunnel magnetoresistance reader of claim 1, wherein the sensor stack comprises:
   an anti-ferromagnetic pinning layer on the bottom shield layer;
   a pinned layer on the anti-ferromagnetic pinning layer;
   a barrier layer on the pinned layer;
   the free layer on the barrier layer; and
   a capping layer on the free layer.

4. The tunnel magnetoresistance reader of claim 3:
   wherein the bottom shield layer comprises one or more materials selected from the group consisting of NiFe, NiCo, CoFe, NiFeCo, CoB, CoFeB, and combinations thereof;
   wherein the anti-ferromagnetic pinning layer comprises one or more materials selected from the group consisting of IrMn, IrMnCr, and combinations thereof;
   wherein the pinned layer comprises one or more materials selected from the group consisting of CoFe, CoB, CoFeB, and combinations thereof;
   wherein the barrier layer comprises one or more materials selected from the group consisting of MgO, AlOx, and combinations thereof, where x is a positive integer;
   wherein the free layer comprises one or more materials selected from the group consisting of NiFe, NiCo, CoFe, Fe, NiFeCo, CoB, CoFeB, Ru, Ta, and combinations thereof; and
   wherein the capping layer comprises one or more materials selected from the group consisting of Ru, Ta, Ti, MgO, and combinations thereof.

5. The tunnel magnetoresistance reader of claim 4, wherein the non-magnetic spacer layer comprises one or more materials selected from the group consisting of NiFeCr, NiCr, Ta, Ru, Cr, oxides of NiFeCr, NiCr, Ta, and Cr, and combinations thereof.

6. The tunnel magnetoresistance reader of claim 5, wherein the soft bias layer comprises one or more materials selected from group consisting of NiFe, NiCo, CoFe, NiCoFe, CoB, CoFeB, Ru, and combinations thereof.

7. The tunnel magnetoresistance reader of claim 4, wherein the insulating layer comprises one or more materials selected from group consisting of alumina, MgO, SiN, SiO2, and combinations thereof.

8. The tunnel magnetoresistance reader of claim 1, wherein the non-magnetic spacer layer consists of a substantially flat layer.

9. A tunnel magnetoresistance reader comprising:
a magnetoresistive sensor stack comprising a free layer and a bottom shield layer and having angled sides;
a soft bias structure adjacent to the sensor stack, wherein the soft bias structure comprises:
a portion of the bottom shield layer;
an insulating layer on the portion of the bottom shield layer and on the angled sides of the sensor stack;
a spacer layer on the insulating layer;
a soft bias layer on the spacer layer; and
a top shield layer on the soft bias layer;
wherein the spacer layer is entirely below the free layer;
wherein the soft bias structure comprises an air bearing surface;
wherein a rear area of the soft bias structure is substantially free of the soft bias layer;
wherein the soft bias structure is positioned between the rear area and the air bearing surface; and
wherein a portion of the insulating layer forms the rear area of the soft bias structure.

10. A tunnel magnetoresistance reader comprising:
a magnetoresistive sensor stack comprising a free layer and a bottom shield layer and having angled sides;
a soft bias structure adjacent to the sensor stack, wherein the soft bias structure comprises:
a portion of the bottom shield layer;
an insulating layer on the portion of the bottom shield layer and on the angled sides of the sensor stack;
a spacer layer on the insulating layer;
a soft bias layer on the spacer layer; and
a top shield layer on the soft bias layer;
wherein the spacer layer is entirely below the free layer;
wherein the soft bias structure comprises an air bearing surface; and
wherein a depth of the spacer layer from the air bearing surface is greater than a depth of the soft bias layer from the air bearing surface.

11. The tunnel magnetoresistance reader of claim 10, wherein a depth of the insulating layer from the air bearing surface is greater than the depth of the spacer layer from the air bearing surface.

* * * * *